(12) United States Patent
Chang

(10) Patent No.: US 6,867,463 B2
(45) Date of Patent: *Mar. 15, 2005

(54) SILICON NITRIDE READ-ONLY-MEMORY (75) Inventor: Kent Kuohua Chang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 4 days.

This patent is subject to a terminal disclaimer.

(21) Appl. No.: 10/248,178

(22) Filed: Dec. 24, 2002

(65) Prior Publication Data
US 2004/0119108 A1 Jun. 24, 2004

(51) Int. Cl.[7] .............................................. H01L 31/113
(52) U.S. Cl. ..................... 257/391; 257/390; 438/257
(58) Field of Search .......................... 257/391, 314–319

(56) References Cited

U.S. PATENT DOCUMENTS 6,538,292 B2 * 3/2003 Chang et al. ............... 257/391
6,674,133 B2 * 1/2004 Chang ........................ 257/391

* cited by examiner

Primary Examiner—Dung A. Le
(74) Attorney, Agent, or Firm—Jianq Chyun IP Office (57) ABSTRACT A silicon nitride read-only-memory structure is provided. The silicon nitride read-only-memory includes a control gate over a substrate, a source region and a drain region in the substrate on each side of the control gate, a charge-trapping layer between the control gate and the substrate and a channel layer in the substrate underneath the charge-trapping layer and between the source region and the drain region. The charge-trapping layer further includes an isolation region. The isolation region partitions the charge-trapping layer into a source side charge-trapping block and a drain side charge-trapping block so that a two-bit structure is formed.

12 Claims, 9 Drawing Sheets

SILICON NITRIDE READ-ONLY-MEMORY

BACKGROUND OF INVENTION

1. Field of Invention

The present invention relates to a type of non-volatile memory. More particularly, the present invention relates to a silicon nitride read-only-memory and fabricating method thereof.

2. Description of Related Art

Non-volatile memory such as electrically erasable programmable read-only-memory (EEPROM) is a versatile storage device that can be activated to receive input data, read out stored data or erase stored data repeatedly. Moreover, data stored inside a non-volatile memory will not be erased even if the power supply to the memory is cut off. Hence, EEPROM is a widely adopted memory device used inside most personal computers and electronic equipment.

A conventional EEPROM has a floating gate and a control gate typically fabricated using doped polysilicon. To program the memory, electrons injected into the floating gate will be distributed evenly across the entire polysilicon layer. However, if the tunneling oxide layer under the floating gate contains defects, leakage current may flow from the device leading to reliability problems.

To prevent leakage current in the EEPROM device, a charge-trapping layer is used in place of the polysilicon floating gate. The charge-trapping layer is a silicon nitride layer, for example. In general, the silicon nitride charge-trapping layer is sandwiched between an upper and a lower silicon oxide layer so that the upper oxide layer, the nitride layer and the lower oxide layer together form an oxide/nitride/oxide (ONO) composite stack gate structure. An EEPROM having such a stacked gate structure is often referred to as a nitride read-only-memory (NROM). When a voltage is applied to the control gate and the source/drain of the device to program the memory, hot electrons are generated in a channel region close to the drain terminal. These hot electrons will inject into the charge-trapping layer. Since the silicon nitride layer has the capacity to trap electrons, electrons injected into the charge-trapping layer will be collected within a localized region instead of distributing evenly across the entire charge-trapping layer. The trapping of electrons within a localized region of the charge-trapping layer leads to a small leakage current because localized electrons have a sensitivity towards defects within the tunnel oxide layer.

Another advantage of having a silicon nitride read-only-memory is that the source/drain region on one side of the stacked gate may receive a higher voltage during programming so that electrons are injected into the silicon nitride layer closer to the other source/drain region or vice versa. By adjusting the control gate and the voltage applied to the source/drain region on each side of the control gate, the silicon nitride layer may contain two batches of electrons, a single batch of electrons or none at all. Consequently, altogether four different storage states can be written into a single nitride read-only-memory cell. In other words, the NROM is a type of 2-bit/cell non-volatile storage memory.

However, the hot electrons injected into the charge-trapping layer of the conventional 2-bit/cell NROM during a programming step will result in an electron distribution curve according to the injection energy level. When two batches of electrons are injected into a memory cell to represent two bits, the electrons within each batch may affect the other through the so-called electron secondary effect. This leads to a widening of each charge distribution curve and their eventually linking up with each other. As a result, the distribution curve that results from injecting holes into the charge-trapping layer may not overlap with the electron distribution curve during an erase operation. In other words, either the data bit is not fully erased or else a longer period is required.

Furthermore, the hot holes are injected into the charge-trapping layer through the drain side (or the source side) in a hot hole erasing operation. Since the number of holes injected into the charge-trapping layer is difficult to control, too many or too few holes may be injected into the charge-trapping layer leading to over-erase or under-erase of data. If over-erase or under-erase occurs too frequently, reliability of the memory device will be severely compromised.

SUMMARY OF INVENTION

Accordingly, one object of the present invention is to provide a silicon nitride read-only-memory and fabricating method thereof that prevents over-erasure and hence improves reliability of the memory device.

A second object of this invention is to provide a silicon nitride read-only-memory and fabricating method thereof that permits a single memory cell to hold more then one bit of data and hence increases the level of device integration.

To achieve these and other advantages and in accordance with the purpose of the invention, as embodied and broadly described herein, the invention provides a silicon nitride read-only-memory structure. The silicon nitride read-only-memory includes a control gate over a substrate, a source region and a drain region in the substrate on each side of the control gate, a charge-trapping layer between the control gate and the substrate and a channel region in the substrate underneath the charge-trapping layer and between the source region and the drain region. The charge-trapping layer further includes an isolation region. The isolation region splits up the charge-trapping layer into a source side charge-trapping block and a drain side charge-trapping block, hence producing a double-bit structure.

In the aforementioned structure, the isolation region within the charge-trapping layer divides the charge-trapping layer into two charge-trapping sections (the source side charge-trapping block and the drain side charge-trapping block) for holding two data bits. Since the isolation region partitions the charge-trapping layer into two independent charge-trapping blocks (that is, the two bits within a memory cell are separated), the secondary electron injection problem is prevented and reliability of the device is improved.

This invention provides an alternative silicon nitride read-only-memory structure. The silicon nitride read-only-memory includes a control gate over a substrate, a charge-trapping layer between the control gate and the substrate, a source region and a drain region in the substrate on each side of the control gate, a channel region in the substrate underneath the charge-trapping layer and between the source region and the drain region and an isolation region within the charge-trapping layer. The isolation region splits up the charge-trapping layer into a plurality of charge-trapping blocks arranged into an array. The direction from the source region to the drain region is the row direction. Each row includes two charge-trapping blocks and each column includes n (n is a positive integer) electron-trapping blocks. Furthermore, before any data is written into the silicon nitride read-only-memory, threshold voltage of the channel region under the same row of charge-trapping blocks is identical while the threshold voltage of the channel region under different row of charge-trapping blocks is different.

In addition, the silicon nitride read-only-memory further includes a gate dielectric layer between the control gate and the charge-trapping layer and a tunneling oxide layer between the charge-trapping layer and the substrate.

In the aforementioned structure, the isolation region within the charge-trapping layer divides the charge-trapping layer into a plurality of charge-trapping blocks and hence forms a multi-bit structure. Furthermore, the channel region under different rows of charge-trapping blocks has a different threshold voltage. Hence, a plurality of data bits can be stored inside a single memory cell so that the overall level of device integration is increased. Moreover, the partitioning of the charge-trapping layer into two independent blocks (that is, the two bits within a memory cell are separated) through the isolation region can prevent the secondary electron injection problem and improve the reliability of the memory device.

This invention also provides a method of fabricating a silicon nitride read-only-memory. First, a silicon oxide layer and a charge-trapping layer are sequentially formed over a substrate. An isolation region is formed in the charge-trapping layer. The isolation region splits the charge-trapping layer into a plurality of charge-trapping blocks. The charge-trapping blocks form an array. The direction from one bit line to another bit line is the row direction of the charge-trapping block array. Each row includes two charge-trapping blocks and each column includes n (n is a positive integer) charge-trapping blocks. Thereafter, a gate dielectric layer is formed over the charge-trapping layer. The gate dielectric layer and the charge-trapping layer are patterned to expose the desired bit line region. Bit lines are formed in the substrate on each side of the charge-trapping layer. A control gate is formed over the charge-trapping layer. Finally, a threshold voltage adjustment step is carried out so that the channel region under a different row of charge-trapping blocks has a different threshold voltage.

In the aforementioned method of fabricating the silicon nitride read-only-memory, the charge-trapping layer is a silicon nitride layer. The isolation region in the charge-trapping layer is formed in several steps. First, a patterned photoresist layer is formed over the charge-trapping layer to expose an area for forming the isolation region. Thereafter, an ion implantation is carried out implanting oxygen ions into the region exposed by the photoresist layer. Finally, an annealing process is conducted so that the implanted oxygen ions and silicon within the charge-trapping layer reacts to form an isolation region.

In addition, the method of fabricating the silicon nitride read-only-memory may further include forming a field oxide layer over the bit line.

In this invention, an isolation region is formed through the implantation of oxygen ions into a designated area of the charge-trapping layer. Because the isolation region divides the charge-trapping layer into a plurality of blocks and the channel layer under each row of charge-trapping blocks has a different threshold voltage, each single memory cell has a multi-bit structure. Hence, the number of bits stored per memory cell can be increased without increasing the overall volume of each cell. In other words, the level of device integration can be increased. Furthermore, the partitioning of the charge-trapping layer into a plurality of independent blocks (that is, isolating various data bit storage location within a memory cell) eliminates the secondary electron injection problem altogether.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1A:
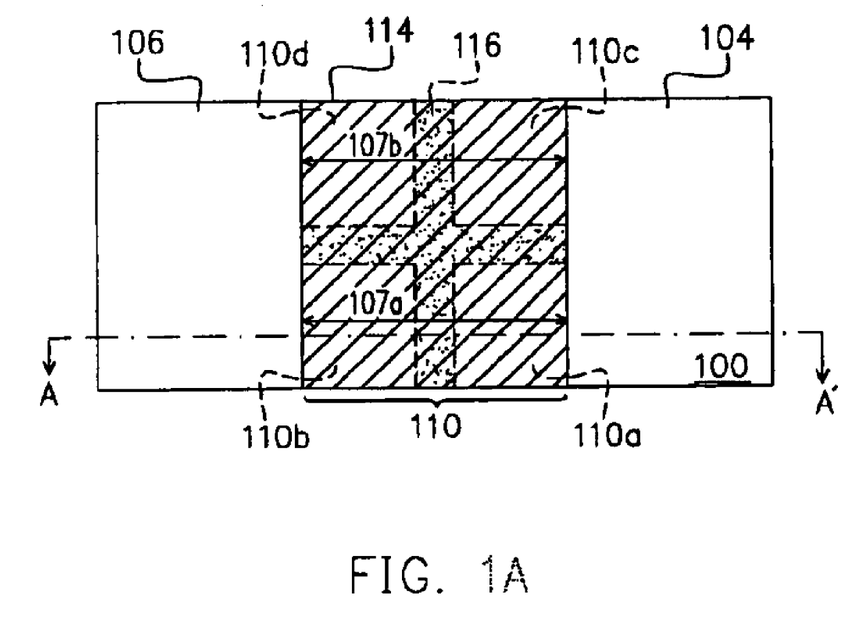
FIG. 1A is a top view of a silicon nitride read-only-memory structure according to one embodiment of this invention.
Figure 1B:
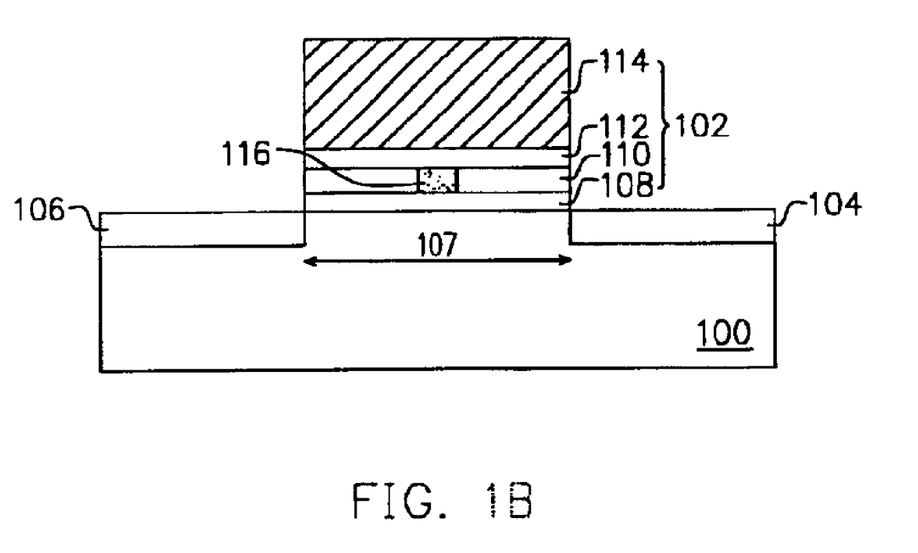
FIG. 1B is a cross-sectional view along line A–A" of FIG. 1A.
Figure 2A:
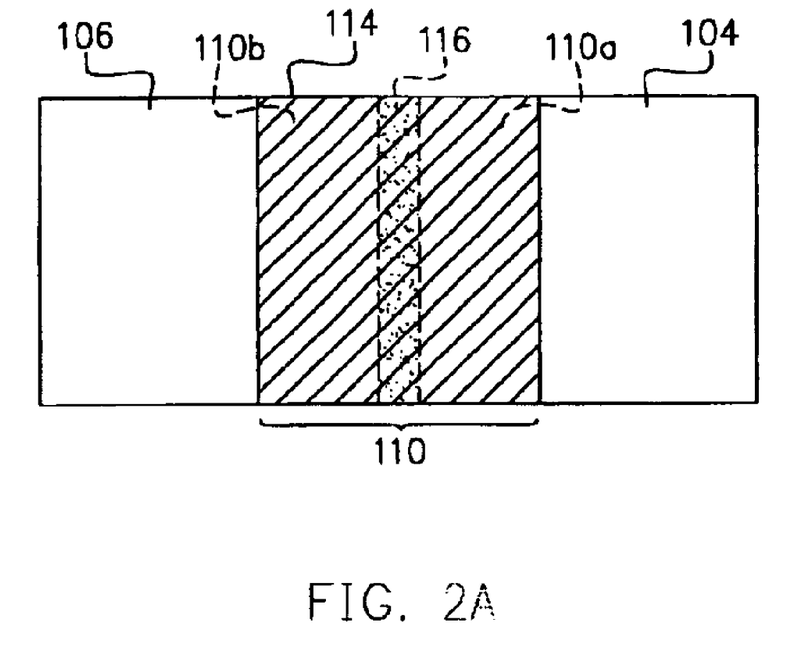
FIGS. 2A and 2B are top views of a silicon nitride read-only-memory structure according to another embodiment of this invention.
Figure 2B:
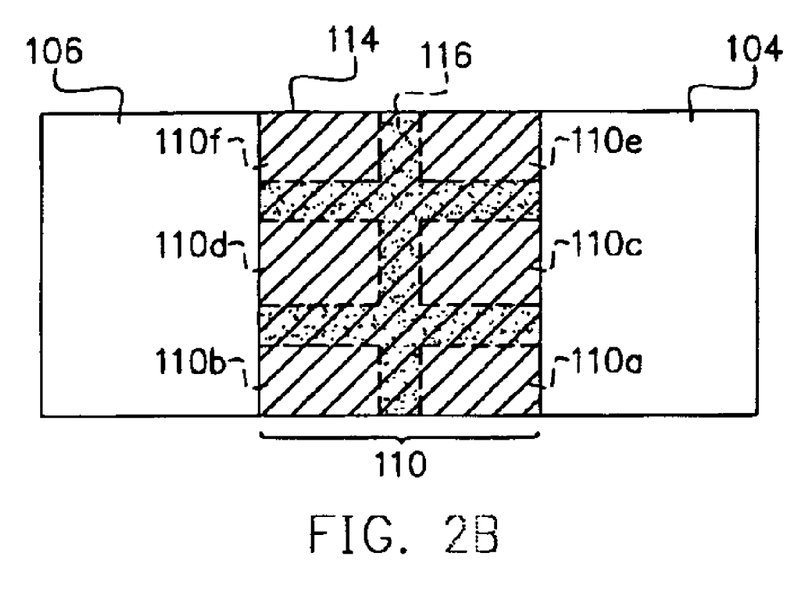

FIG. 1A is a top view of a silicon nitride read-only-memory structure according to one embodiment of this invention. FIG. 1B is a cross-sectional view along line A–A" of FIG. 1A. FIGS. 2A and 2B are top views of two silicon nitride read-only-memory structures according to another embodiment of this invention. In FIGS. 2A and 2B, elements identical to the one in FIGS. 1A and 1B are labeled identically.

As shown in FIGS. 1A and 1B, the silicon nitride read-only-memory of this invention is composed of a substrate 100, a gate structure 102, a source region 104, a drain region 106 and a channel region 107. The gate structure 102 is formed over the substrate 100. The source region 104 and the drain region 106 are formed in the substrate 100 on each side of the gate structure 102. The channel region 107 is formed in the substrate 100 between the source region 104 and the drain region 106 underneath the gate structure 102.

The gate structure 102 includes a tunneling oxide layer 108, a charge-trapping layer 110, a gate dielectric layer 112 and a control gate 114. The control gate 114 is formed over the substrate 100. The charge-trapping layer 110 is formed between the control gate 114 and the substrate 100. The gate dielectric layer 112 is positioned between the control gate 114 and the charge-trapping layer 110. The gate dielectric layer 112 is a silicon oxide layer, for example. The tunneling oxide layer 108 is positioned between the charge-trapping layer 110 and the substrate 100. The charge-trapping layer 110 has an isolation region 116. The isolation region 116 partitions the charge-trapping layer 110 into a plurality of charge-trapping blocks each holding a single data bit. The charge-trapping blocks form an array with the direction from the source region 104 to the drain region 106 being the row direction of the array. In the charge-trapping block array, each row includes two charge-trapping blocks and each column includes a plurality of charge-trapping blocks. Before data is written into the silicon nitride read-only-memory, the channel region under the same row of charge-trapping blocks has an identical threshold voltage. However, the channel region under different row of charge-trapping blocks has different threshold voltage. In this embodiment, the charge-trapping layer 110 is divided into four (2 by 2 array) charge-trapping blocks (110a, 110b, 1110c and 110d). Hence, before any data is written into the memory, the channel region 107a under the first row of charge-trapping blocks 110a, 110b has the same threshold voltage. Similarly, before any data is written into the memory, the channel region 107b under the second row of charge-trapping blocks 110c, 110d has the same threshold voltage. Nevertheless, the threshold voltage of the channel region 107a under the charge-trapping blocks 110a, 110b and the threshold voltage of the channel region 107b under the charge-trapping blocks 110c, 110d are different.

In the aforementioned silicon nitride read-only-memory structure, the isolation region 116 divides the charge-trapping layer 110 into four charge-trapping blocks (110a, 110b, 110c and 110d) to form four identical bit structures. Furthermore, threshold voltage in the channel region 107a under the charge-trapping blocks 110a, 110b and threshold voltage in the channel region 107b under the charge-trapping blocks 110c, 110d are different. In other words, altogether four data bits can be stored inside a single memory cell leading to a considerable increase in the level of device integration. In addition, the isolation region 16 also partitions the charge-trapping layer 110 into four independent charge-trapping blocks (representing four independent bits in a memory cell). Hence, the secondary electron injection problem is eliminated so that reliability of the memory device is improved.

Although the aforementioned charge-trapping layer 110 is partitioned into four charge-trapping blocks 110a~110d, the charge-trapping layer 110 can be partitioned into any other number of charge-trapping blocks within manufacturing limits. For example, the charge-trapping layer 110 can be partitioned into two charge-trapping blocks (the charge-trapping blocks 110a, 110b in FIG. 2A) or six charge-trapping blocks (the charge-trapping blocks 110a to 110f in FIG. 2B). As long as the channel region under different rows of charge-trapping blocks has a different threshold voltage, a multi-bit memory structure is formed within each memory cell.

FIGS. 3A to 3G are top views showing the progression of steps for fabricating a silicon nitride read-only-memory according to this invention. FIGS. 4A to 4G are cross-sectional views along line B–B" of FIGS. 3A to 3G respectively.

Figure 3A:
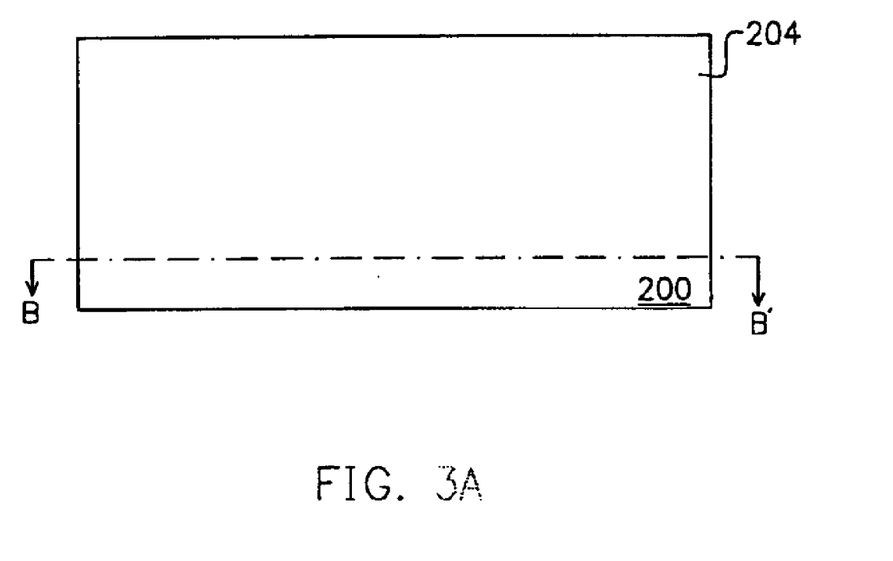
FIGS. 3A to 3G are top views showing the progression of steps for fabricating a silicon nitride read-only-memory according to this invention.
Figure 4A:
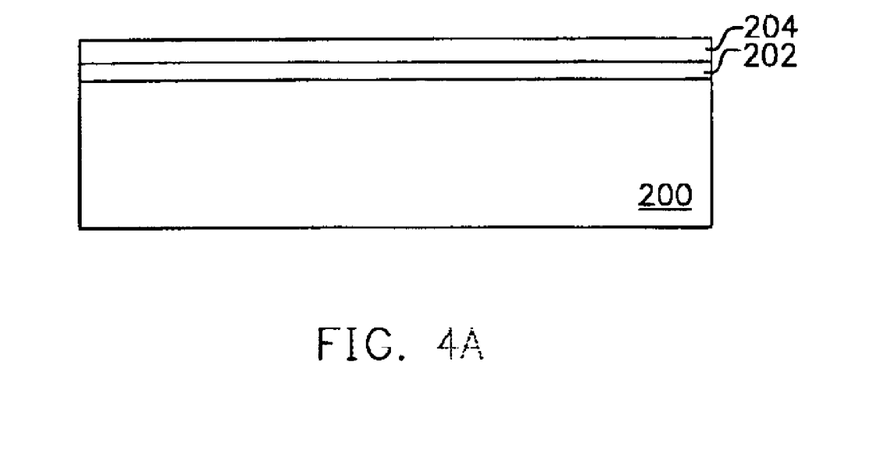
FIGS. 4A to 4G are cross-sectional views along line B–B" of FIGS. 3A to 3G respectively.

First, as shown in FIGS. 3A and 4A, a substrate 200 such as a silicon substrate is provided. An oxide layer 202 serving as a tunneling oxide layer is formed over the substrate 200. The oxide layer 202 is formed, for example, by conducting a thermal oxidation. Thereafter, a charge-trapping layer 204 is formed over the oxide layer 202. The charge-trapping layer 204 is, for example, a silicon nitride layer formed by chemical vapor deposition.

Figure 3B:
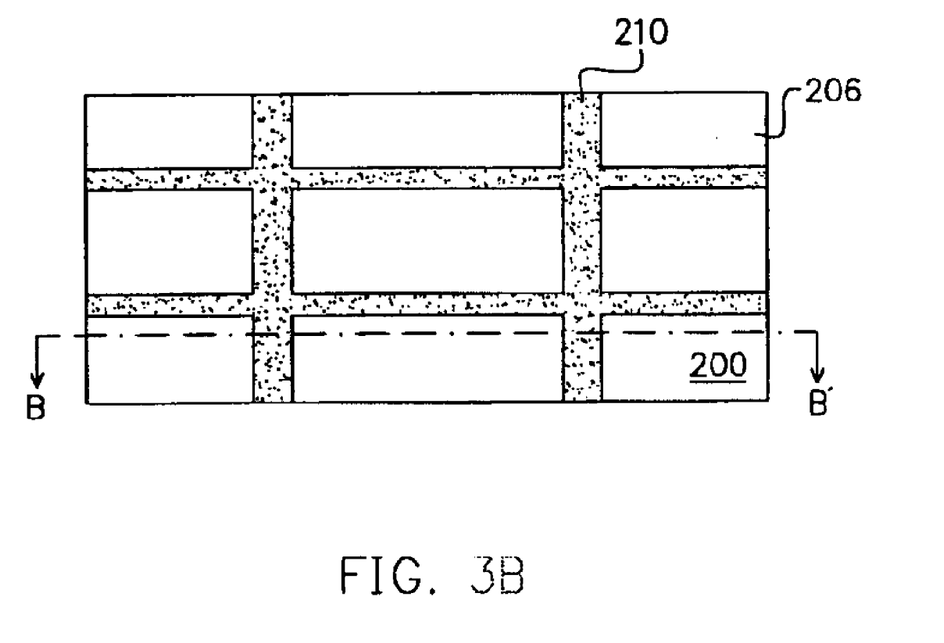
Figure 4B:
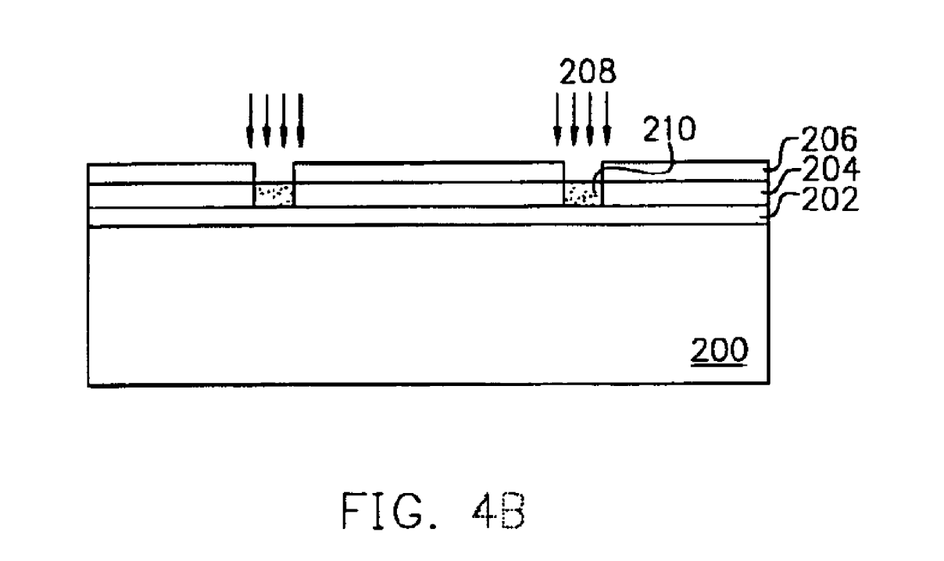

As shown in FIGS. 3B and 4B, a patterned photoresist layer 206 is formed over the charge-trapping layer 204. The patterned photoresist layer 206 exposes the area in the charge-trapping layer 204 for forming an isolation region. An ion implantation 208 is carried out implanting oxygen ions into the exposed charge-trapping layer 204 using the patterned photoresist layer 206 as a mask. Hence, a doped oxygen region 210 is formed within the charge-trapping layer 204. The oxygen ion implantation 208 is carried out using an implant dosage of between $1 \times 10^{18}$ atoms/cm$^2$ to $2 \times 10^{18}$ atoms/cm$^2$ and an implant energy level between 20 keV to 80 keV.

Figure 3C:
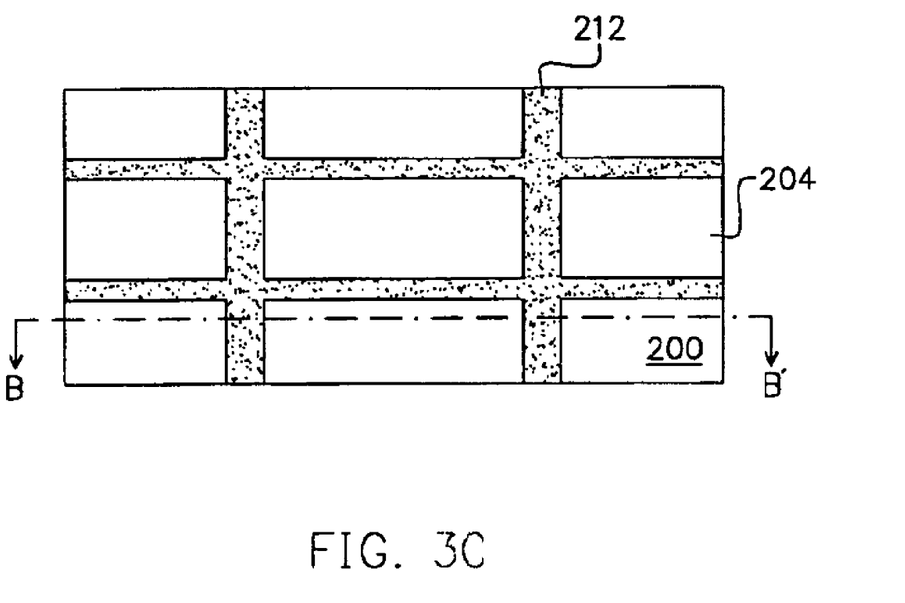
Figure 4C:
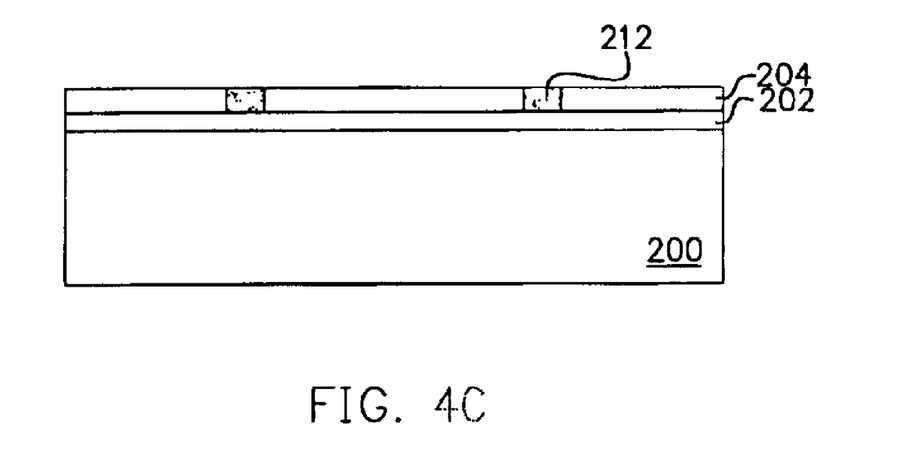

As shown in FIGS. 3C and 4C, the patterned photoresist layer 206 is removed. An annealing process is carried out so that the oxygen ions and silicon within the charge-trapping layer 204 react to form an oxide isolation region 212. The annealing process is carried out at a temperature between 950° C. to 1150° C., for example. The isolation region 212 partitions the charge-trapping layer 204 into a plurality of charge-trapping blocks. In this embodiment, altogether four charge-trapping blocks are partitioned out of the charge-trapping layer 204 through the isolation region 212.

Figure 3D:
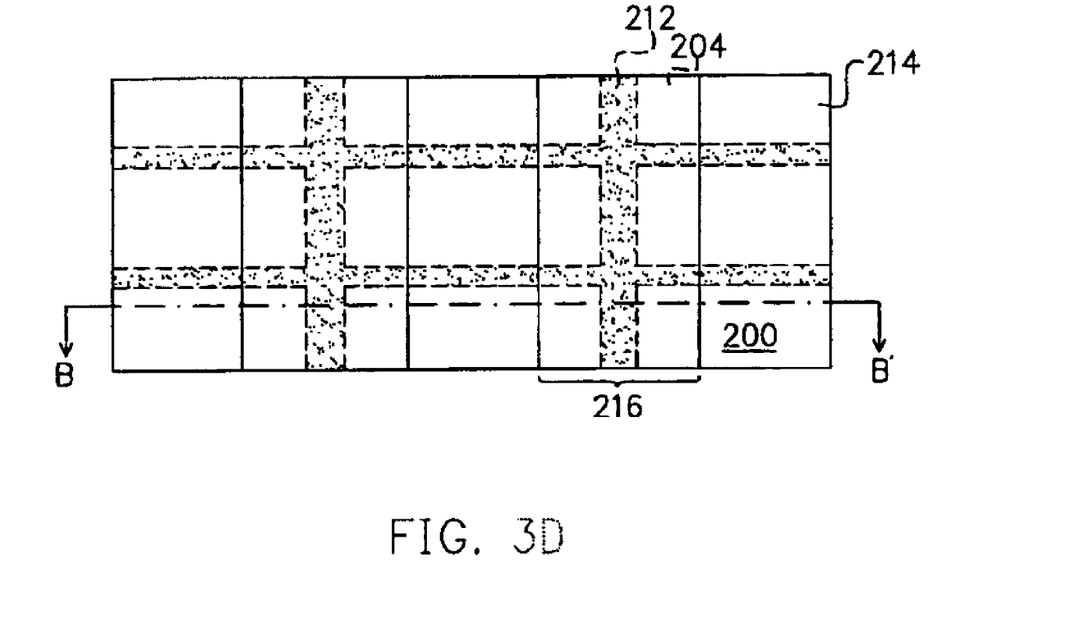
Figure 4D:
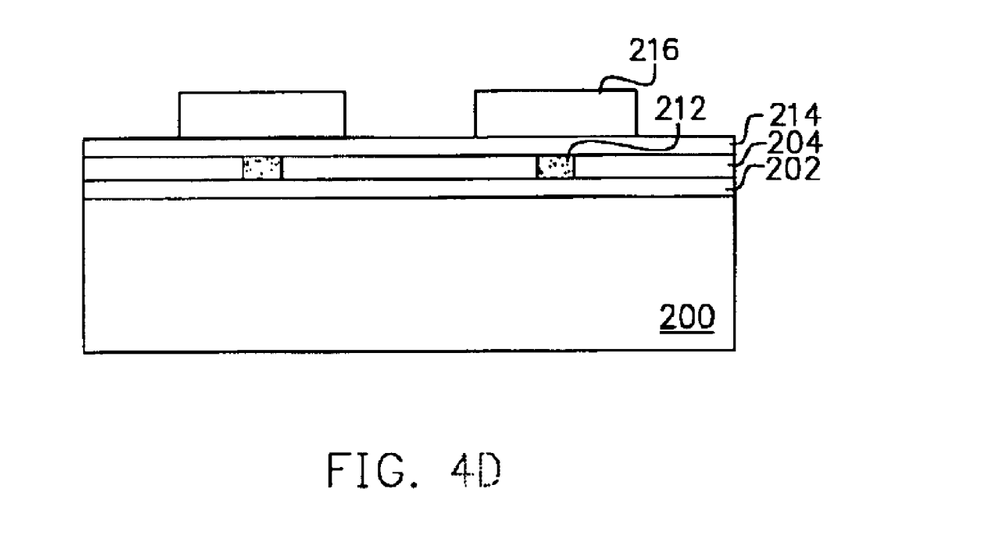

As shown in FIGS. 3D and 4D, a gate dielectric layer 214 is formed over the substrate 200. The gate dielectric layer is, for example, a silicon oxide layer having a thickness between about 50 Å to 150 Å. The gate dielectric layer 214 is formed, for example, by chemical vapor deposition. Thereafter, another patterned photoresist layer 216 is formed over the gate dielectric layer 214. The patterned photoresist layer 216 exposes an area for forming a bit line.

Figure 3E:
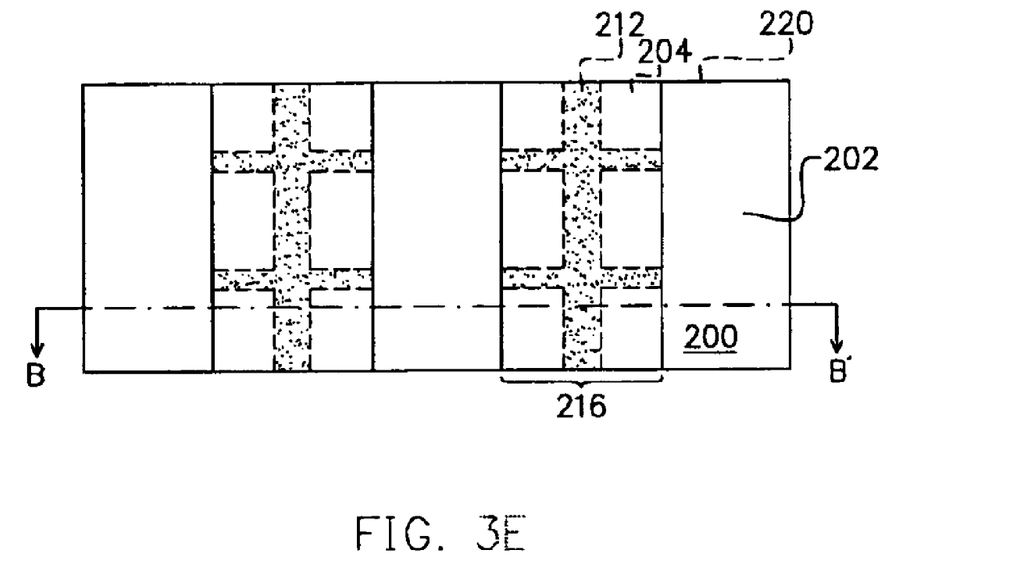
Figure 4E:
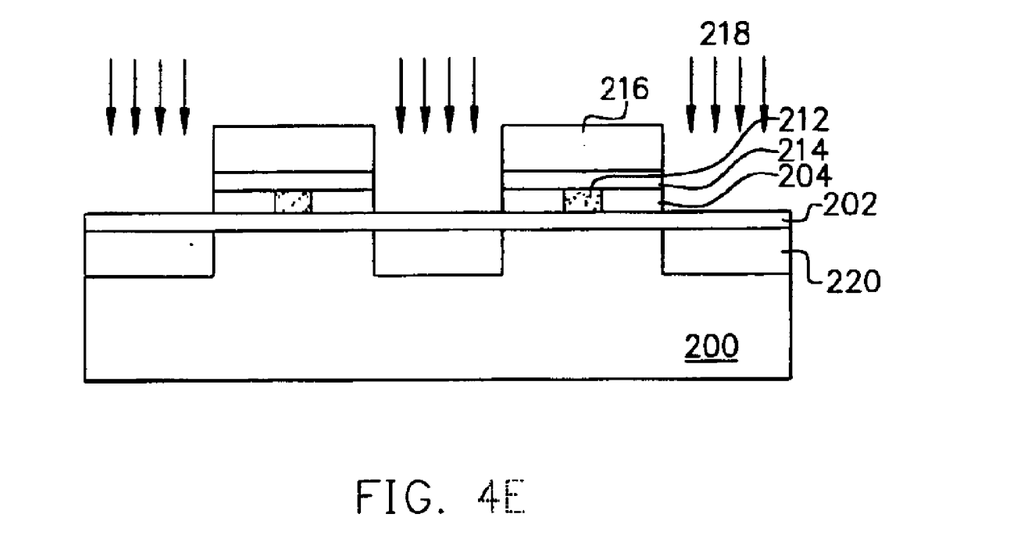

As shown in FIGS. 3E and 4E, using the patterned photoresist layer as an etching mask, a portion of the gate dielectric layer 214 and the charge-trapping layer 204 is removed to expose an area for forming a bit line. Another ion implantation 218 is carried out using the patterned photoresist layer 216 as a mask so that dopants are implanted into the substrate 200 to form doped regions 220 (bit line). The implantation 218 is carried out using arsenic ions at a dosage level between $2 \times 10^{15}$ atoms/cm$^2$ to $4 \times 10^{15}$ atoms/cm$^2$ and an energy level of about 50 keV.

Figure 3F:
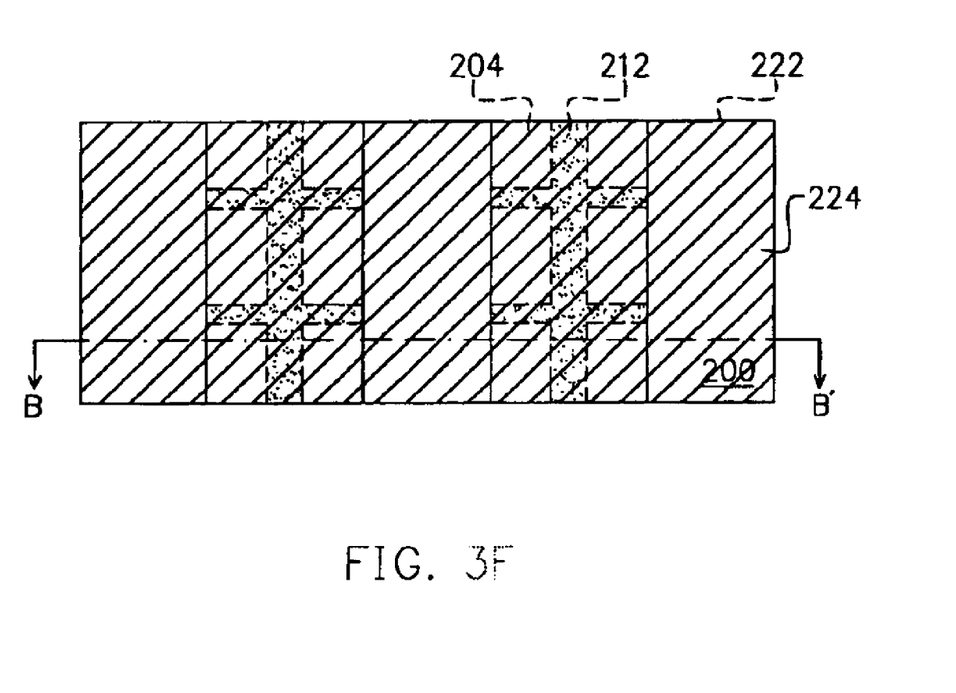
Figure 4F:
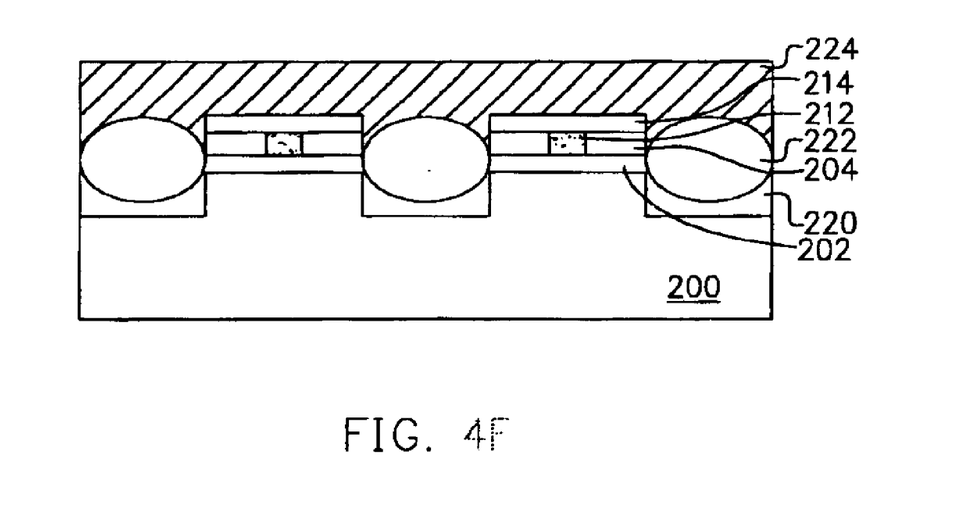

As shown in FIGS. 3F and 4F, the photoresist layer 216 is removed. Thereafter, a thermal processing is conducted to form a field oxide layer 222 on the surface of the doped region 220 (bit line) and activate the dopants within the doped region 220. The field oxide layer 222 isolates the doped region 220 (bit line) from a subsequently formed control gate (word line). A conductive layer 224 such as a doped polysilicon layer is formed over the substrate 200. The conductive layer 224 is formed, for example, by chemical vapor deposition with in-situ deposition of dopants.

Figure 3G:
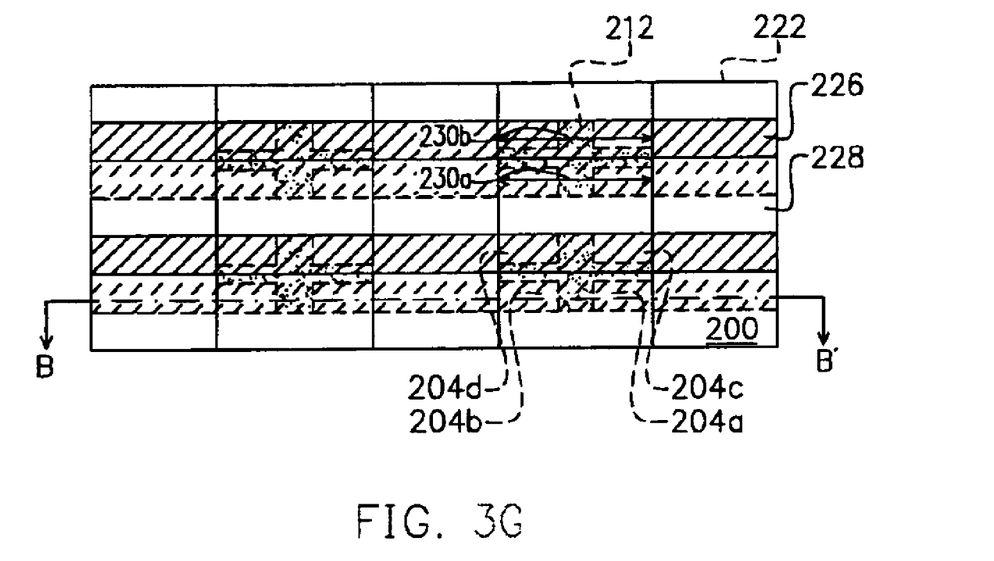
Figure 4G:
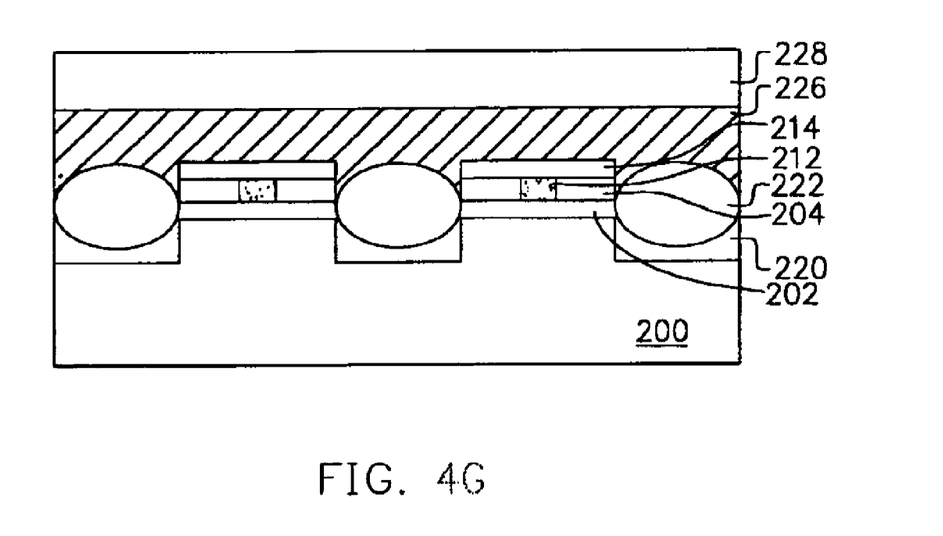

As shown in FIGS. 3G and 4G, the conductive layer 224 is patterned using a mask (not shown) so that a control gate 226 (word line) is defined. In the meantime, the same mask is used to pattern the gate dielectric layer 214, the charge-trapping 204 and the dielectric layer 202 into a gate structure. In other words, the control gate 226, the gate dielectric layer 214, the charge-trapping layer 204 and the oxide layer 202 together constitute the gate structure of the silicon nitride read-only-memory in this invention. In this embodiment, the charge-trapping layer 204 of each memory cell at least includes four detached charge-trapping blocks 204a, 204b, 204c, 204d separated by the isolation region 212. The four charge-trapping blocks 204a, 204b, 204c, 204d together constitute a 2×2 array.

A threshold voltage adjustment is next carried out. First, a patterned photoresist layer 228 is formed over the substrate 200. The patterned photoresist layer 228 at least exposes the control gate 226 above the charge-trapping blocks 204c, 204d. Using the patterned photoresist layer 228 as a mask, an ion implantation is carried out implanting dopants into the channel region 230b underneath the charge-trapping blocks 204c, 204d to modify the threshold voltage of the channel region 230b. Ultimately, the threshold voltage of the channel region 230b under the charge-trapping blocks 204c, 204d is different from the threshold voltage of the channel region 230a under the charge-trapping blocks 204a, 204b. Hence, a memory cell capable of holding 4 bits of data is produced. Finally, other steps necessary for forming a complete silicon nitride read-only memory are carried out. Since these subsequent steps are familiar to those skilled in the art of manufacturing, detailed description those steps is omitted here.

In the aforementioned embodiment, oxygen ions are implanted into the charge-trapping layer 204 to form the isolation region 212 that partitions the charge-trapping layer 204 into a plurality of charge-trapping blocks and hence a multi-bit structure. Thus, the bit storage capacity of each memory cell is increased without increasing overall volume of the memory cell. Therefore, the level of device integration is increased considerably. Furthermore, the partition of the charge-trapping layer 204 into four isolated blocks (the detachment of the four bit structures inside the memory cell) through the isolation region 212 also prevents secondary electron injection.

In addition, the isolation region can also be used to partition the charge-trapping layer 204 into more than four blocks (for example, six or eight blocks) as long as threshold voltages of the channel under each row of charge-trapping blocks are set to have a different value.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon nitride read-only-memory, comprising:
   a substrate;
   a control gate over the substrate;
   a source region and a drain region in the substrate on each side of the control gate;
   a charge-trapping layer between the control gate and the substrate, wherein an isolation region partitions the charge-trapping layer into a source charge-trapping block and a drain charge-trapping block to produce a two bit structure; and
   a channel region in the substrate underneath the charge-trapping layer and between the source region and the drain region.

2. The silicon nitride read-only-memory of claim 1, wherein the memory may further include a gate dielectric layer positioned between the control gate and the charge-trapping layer.

3. The silicon nitride read-only-memory of claim 2, wherein the gate dielectric layer includes a silicon oxide layer.

4. The silicon nitride read-only-memory of claim 1, wherein the memory may further include a tunneling oxide layer positioned between the charge-trapping layer and the substrate.

5. The silicon nitride read-only-memory of claim 1, wherein material forming the charge-trapping layer includes silicon nitride.

6. The silicon-nitride read-only--memory of claim 1, wherein material forming the isolation region includes silicon oxide.

7. A silicon nitride read-only-memory, comprising:
   a substrate;
   a control gate over the substrate;
   a charge-trapping layer between the control gate and the substrate;
   a source region and a drain region in the substrate on each side of the control gate;
   a channel region in the substrate underneath the charge-trapping layer and between the source region and the drain region; and
   an isolation region within the charge-trapping layer, wherein the isolation region partitions the charge-trapping layer into an array of charge-trapping blocks, the row direction of the array is from the source region to the drain region, each row of the array includes two charge-trapping blocks and each column of the array includes n (where n is a positive integer) charge-trapping blocks;
   wherein the channel region under the same row of charge-trapping blocks has an identical threshold voltage and the channel region under different rows of charge-trapping blocks has different threshold voltage before any data is written into the silicon nitride read-only-memory.

8. The silicon nitride read-only-memory of claim 7, wherein the memory may further include a gate dielectric layer positioned between the control gate and the charge-trapping layer.

9. The silicon nitride read-only-memory of claim 8, wherein the gate dielectric layer includes a silicon oxide layer.

10. The silicon nitride read-only-memory of claim 8, wherein the memory may further include a tunneling oxide layer positioned between the charge-trapping layer and the substrate.

11. The silicon nitride read-only-memory of claim 8, wherein material forming the charge-trapping layer includes silicon nitride.

12. The silicon-nitride read-only-memory of claim 8, wherein material forming the isolation region includes silicon oxide.

* * * * *